US012701683B2

(12) United States Patent
Tsuyuno et al.

(10) Patent No.: US 12,701,683 B2
(45) Date of Patent: Aug. 4, 2026

(54) SEMICONDUCTOR DEVICE

(71) Applicant: Hitachi Astemo, Ltd., Hitachinaka (JP)

(72) Inventors: Nobutake Tsuyuno, Tokyo (JP); Yujiro Kaneko, Hitachinaka (JP); Yusuke Takagi, Hitachinaka (JP)

(73) Assignee: Hitachi Astemo, Ltd., Hitachinaka (JP)

(*) Notice: Subject to any disclaimer, the term of this patent is extended or adjusted under 35 U.S.C. 154(b) by 384 days.

(21) Appl. No.: 18/561,923

(22) PCT Filed: Mar. 4, 2022

(86) PCT No.: PCT/JP2022/009579
§ 371 (c)(1),
(2) Date: Nov. 17, 2023

(87) PCT Pub. No.: WO2022/270022
PCT Pub. Date: Dec. 29, 2022

(65) Prior Publication Data
US 2024/0243032 A1 Jul. 18, 2024

(30) Foreign Application Priority Data

Jun. 23, 2021 (JP) ................................ 2021-104416

(51) Int. Cl.
*H10W 40/20* (2026.01)
*H05K 7/20* (2006.01)
(Continued)

(52) U.S. Cl.
CPC ...... *H05K 7/20927* (2013.01); *H10W 40/242* (2026.01); *H10W 40/47* (2026.01); *H10W 40/70* (2026.01)

(58) Field of Classification Search
CPC ........... H05K 7/20927; H10W 40/242; H10W 40/47; H10W 40/40
See application file for complete search history.

(56) References Cited

U.S. PATENT DOCUMENTS 5,150,274 A * 9/1992 Okada ................. H10W 40/257
361/689
6,542,365 B2 * 4/2003 Inoue .................... H10W 40/47
361/689

(Continued)

FOREIGN PATENT DOCUMENTS

JP 2009-182312 A 8/2009
JP 2014045014 A * 3/2014
JP 2014-67902 A 4/2014

OTHER PUBLICATIONS

Japanese-language Office Action issued in Japanese Application No. 2021-104416 dated Jan. 7, 2055 with English translation (10 pages).
(Continued)

*Primary Examiner* — Zachary Pape
(74) *Attorney, Agent, or Firm* — Crowell & Moring LLP

(57) ABSTRACT

In an electric circuit body, at least one of the cooling members fixed to both surfaces of a first semiconductor module and a second semiconductor module includes a first heat dissipation region that abuts on the first semiconductor module through a heat conduction member, a second heat dissipation region that abuts on the second semiconductor module through the heat conduction member, and a low rigidity portion formed between the first heat dissipation region and the second heat dissipation region to have lower rigidity than the first heat dissipation region and the second heat dissipation region; and the fixing member fixes the cooling member to both surfaces of the first semiconductor module and the second semiconductor module in the low rigidity portion of the cooling member.

11 Claims, 12 Drawing Sheets

400

(51) Int. Cl.
      *H10W 40/47*        (2026.01)
      *H10W 40/70*        (2026.01)

(56)                  References Cited

U.S. PATENT DOCUMENTS

| | | | | |
|---|---|---|---|---|
| 8,736,048 | B2 * | 5/2014 | Schultz | H10W 40/40 |
| | | | | 257/679 |
| 9,313,922 | B2 * | 4/2016 | Müller | H05K 7/20318 |
| 10,215,504 | B2 * | 2/2019 | Coteus | F28F 3/044 |
| 11,058,030 | B2 * | 7/2021 | Tian | H05K 7/20254 |
| 12,048,130 | B2 * | 7/2024 | Siewert | H05K 7/209 |
| 12,120,857 | B2 * | 10/2024 | Siewert | H05K 7/209 |

OTHER PUBLICATIONS

International Search Report (PCT/ISA/210) issued in PCT Application No. PCT/JP2022/009579 dated May 31, 2022 With English translation (4 pages).
Japanese-language Written Opinion (PCT/ISA/237) issued in PCT Application No. PCT/JP2022/009579 dated May 31, 2022 with English translation (7 pages).

* cited by examiner

FIG. 10

SEMICONDUCTOR DEVICE

CROSS-REFERENCE TO RELATED APPLICATIONS

This application claims the priority of Japanese application 2021-104416, filed Jun. 23, 2021, which was filed as International Application No. PCT/JP2022/009579, on Mar. 4, 2022, the disclosure of which is expressly incorporated by reference herein.

TECHNICAL FIELD

The present invention relates to an electric circuit body and a power conversion device.

BACKGROUND ART

A power conversion device using a semiconductor module in which a semiconductor element is sealed has high conversion efficiency, and thus is widely used for consumer use, in-vehicle use, railway use, transformation equipment, and the like. Since this semiconductor element generates heat by energization, the power conversion device is required to have high heat dissipation. In particular, in an in-vehicle application, a highly efficient cooling system using water cooling is adopted for miniaturization and weight reduction.

PTL 1 discloses a semiconductor cooling structure in which, between a pair of cooling pipes through which a cooling medium flows, a plurality of semiconductor modules each incorporating a semiconductor element are arranged in parallel with a gap portion provided in between, where a sandwiching means configured to press the pair of cooling pipes against the semiconductor modules is individually disposed for each semiconductor module, at least one of the pair of cooling pipes is provided with a deformable portion deformable by a pressurization force of the sandwiching means at a portion facing the gap portion between adjacent semiconductor modules.

CITATION LIST

Patent Literature

PTL 1: JP 2009-182312 A

SUMMARY OF INVENTION

Technical Problem

PTL 1 has a structure in which a semiconductor module is pressed by a sandwiching means, and has a disadvantage that the device becomes thick.

Solution to Problem

An electric circuit body according to the present invention includes a first semiconductor module and a second semiconductor module in which power semiconductor elements are sealed, respectively; cooling member that cools heat transferred from the power semiconductor elements; and a fixing member that fixes the cooling member to both surfaces of the first semiconductor module and the second semiconductor module arranged side by side; where at least one of the cooling members fixed to both surfaces of the first semiconductor module and the second semiconductor module includes a first heat dissipation region that abuts on the first semiconductor module through a heat conduction member, a second heat dissipation region that abuts on the second semiconductor module through the heat conduction member, and a low rigidity portion formed between the first heat dissipation region and the second heat dissipation region to have lower rigidity the first heat dissipation region and the second heat dissipation region; and the fixing member fixes the cooling member to both surfaces of the first semiconductor module and the second semiconductor module in the low rigidity portion of the cooling member.

Advantageous Effects of Invention

As a result, the device can be thinned while maintaining heat dissipation.

BRIEF DESCRIPTION OF DRAWINGS

FIG. 10 is a circuit diagram of a power conversion device using a semiconductor module.

DESCRIPTION OF EMBODIMENTS

Figure 1:
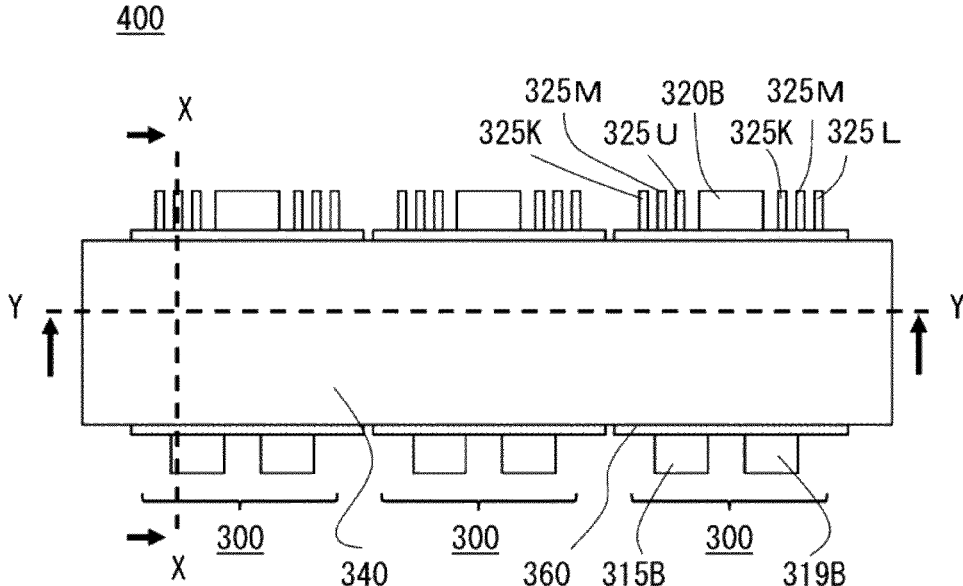
FIG. 1 is a plan view of an electric circuit body.

Hereinafter, embodiments of the present invention will be described with reference to the drawings. The following description and drawings are examples for describing the present invention, and are omitted and simplified as appropriate for the sake of clarity of description. The present invention can be implemented in various other forms. Unless otherwise specified, each component may be singular or plural.

Positions, sizes, shapes, ranges, and the like of the components illustrated in the drawings may not represent actual positions, sizes, shapes, ranges, and the like in order to facilitate understanding of the invention. Therefore, the present invention is not necessarily limited to the position, size, shape, range, and the like disclosed in the drawings.

FIG. 1 is a plan view of one embodiment of an electric circuit body 400 according to the present embodiment.

The electric circuit body 400 includes a semiconductor module 300 and a cooling member 340. The semiconductor module 300 has a function of converting direct current (DC) and alternating current (AC) using an interiorly sealed power semiconductor element, and has a structure of cooling the heat generated by energization with a refrigerant. As the refrigerant, water, an anti-freezing fluid in which ethylene glycol is mixed with water, or the like is used. The semiconductor module 300 includes a positive electrode side terminal 315B and a negative electrode side terminal 319B coupled to a capacitor module 500 (see FIG. 10) of a DC circuit, and a power terminal, through which a large current flows, such as an AC side terminal 320B coupled to motor generators 192 and 194 (see FIG. 10) of an AC circuit, or the like. In addition, signal terminals used for controlling the semiconductor module 300, such as a lower arm gate terminal 325L, a mirror emitter signal terminal 325M, a Kelvin emitter signal terminal 325K, an upper arm gate terminal 325U, a mirror emitter signal terminal 325M, and a Kelvin emitter signal terminal 325K are provided.

Figure 2:
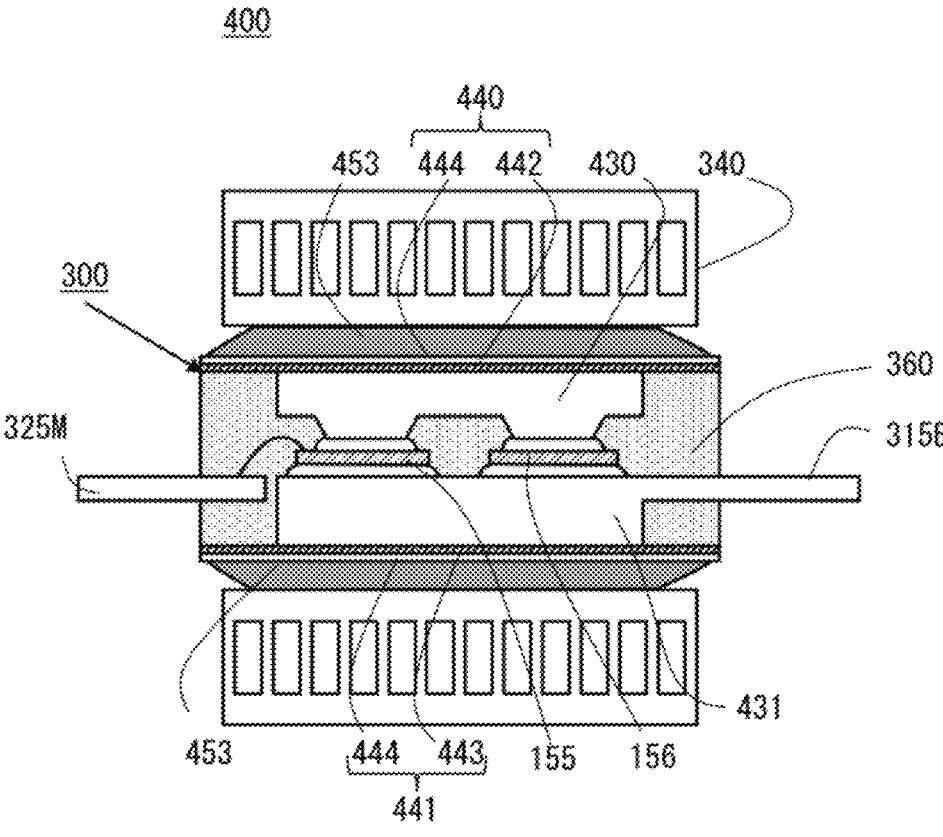
FIG. 2 is a cross-sectional view taken along line X-X of the electric circuit body.
Figure 3:
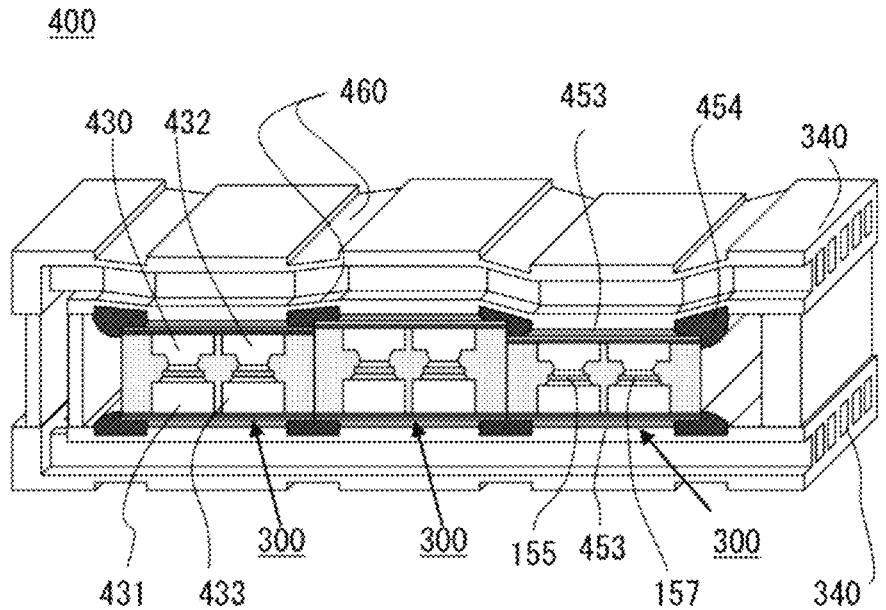
FIG. 3 is a cross-sectional view taken along line Y-Y of the electric circuit body.
Figure 4:
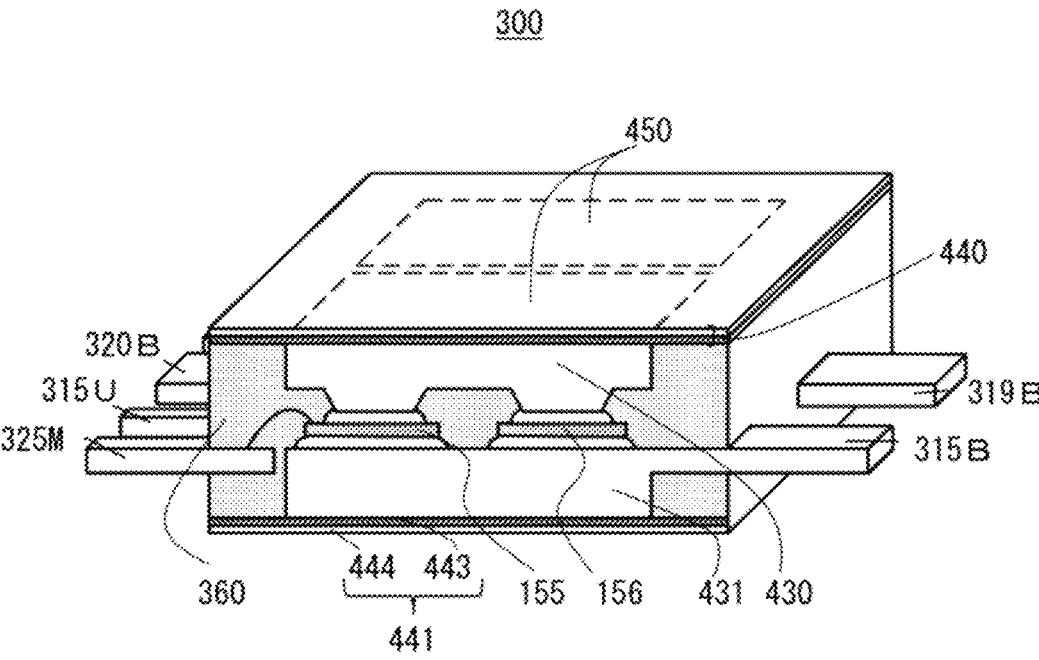
FIG. 4 is a cross-sectional perspective view of a semiconductor module.

FIG. 2 is a cross-sectional view taken along line X-X of the electric circuit body 400 shown in FIG. 1, FIG. 3 is a cross-sectional view taken along line Y-Y of the electric circuit body 400 shown in FIG. 1, and FIG. 4 is a cross-sectional perspective view taken along line X-X of the semiconductor module 300 in a state where the cooling member 340 is removed.

As power semiconductor elements 155 and 156 forming the upper arm circuit, an active element 155 and a diode 156 are provided. As a material of the active element 155 or the diode 156, a semiconductor material such as Si, SiC, GaN, GaO, or C can be used. When a body diode of the active element 155 is used as the diode 156, an additionally attached diode may be omitted. A conductor plate 431 is joined to the collector side of the power semiconductor elements 155 and 156. For this joining, solder may be used or sintered metal may be used. A conductor plate 430 is joined to the emitter side of the power semiconductor elements 155 and 156. As power semiconductor elements 157 and 158 forming the lower arm circuit, an active element 157 and a diode 158 are provided. A conductor plate 433 is joined to the collector side of the power semiconductor elements 157 and 158. A conductor plate 432 is joined to the emitter side of the power semiconductor elements 157 and 158. These may be used alone, but may be subjected to plating with Ni, Ag, or the like in order to improve the joining property with solder or sintered metal. The conductor plates 430, 431, 432, and 433 are not particularly limited as long as they are made of a material having high electrical conductivity and thermal conductivity, but a copper-based or aluminum-based material is desirable. The conductor plates 430, 431, 432, and 433 play a role of a heat transfer member that transfers heat generated by the power semiconductor elements 155, 156, 157, and 158 to the cooling member 340 in addition to a role of passing current.

Since the conductor plates 430, 431, 432, and 433 and the cooling member 340 have different potentials, insulating layers 442 and 443 are provided therebetween. As the insulating layers 442 and 443, a resin-based insulating layer may be used or a ceramic-based insulating layer may be used. The ceramic-based insulating layer has an advantage of having excellent thermal conductivity. The resin-based insulating layer can have adhesiveness and can be pressure-bonded to the conductor plates 430, 431, 432, and 433, and thus has an advantage of having excellent productivity. In the present embodiment, an example of a resin-based insulating layer is illustrated. By combining the insulating layers 442 and 443 with a metal foil 444 to form sheet-like members 440 and 441 workability at the time of production can be improved as an insulating sheet having adhesiveness only on one surface. The insulating layers 442, 443 can be protected by having the metal foil 444 on the side that comes into contact with the cooling member 340. A heat conduction member 453 is provided between each of the sheet-like members 440 and 441 and the cooling member 340 to reduce contact thermal resistance. The power semiconductor elements 155, 156, 157, and 158 and the conductor plates 430, 431, 432, and 433 are sealed with a sealing member 360 by transfer molding. The ends of the sheet-like members 440 and 441 may be buried in the sealing member 360 to be protected in order to prevent peeling from the ends.

In the semiconductor module 300, the thickness varies due to a variation in the thickness of a material of the conductor plates 430, 431, 432, and 433 and a variation in the height of a joining member connecting the power semiconductor elements 155, 156, 157, and 158. Even when the conductor plates 430, 431, 432, and 433 and the sealing member 360 are ground for the purpose of reducing the variation in the thickness of the semiconductor module 300, the variation in the thickness of the semiconductor module 300 cannot be eliminated due to the variation in the grinding process. Although FIG. 4 illustrates one semiconductor module 300, when other semiconductor modules 300 having different thicknesses are adjacent thereto, the thickness to the heat dissipation surface 450 of each semiconductor module 300 is different.

In general, in a case where a plurality of semiconductor modules 300 having variations in thickness are arranged in parallel, and the cooling member 340 is disposed on both surfaces thereof, the thickness of the heat conduction member 453 between the semiconductor modules 300 and the cooling members 340 becomes thin in the thick semiconductor module 300. Conversely, in the thin semiconductor module 300, the thickness of the heat conduction member 453 between the semiconductor module 300 and the cooling member 340 becomes thick. When heat generated by the power semiconductor elements 155, 156, 157, and 158 is cooled by the cooling member 340, the thermal conductivity of the heat conduction member 453 is the lowest, which becomes a bottleneck of heat dissipation. The conductor plates 430, 431, 432, and 433 and the cooling member 340 are metal members such as copper and aluminum, and the joining member is also a metal member such as solder and sintered metal, and has high thermal conductivity. On the other hand, the insulating layers 442 and 443 of the sheet-like members 440 and 441 and the heat conduction member 453 are non-metal based and have low thermal conductivity. Even when the insulating layers 442 and 443 are compared with the heat conduction member 453, the thermal conductivity of the heat conduction member 453 becomes low. This is because, even when both are made of the same resin type, the insulating layers 442 and 443 can be highly filled with the highly thermally conductive filler by kneading the highly thermally conductive filler and the resin in a solvent and then volatilizing the solvent. However, since the heat conduction member 453 is applied to a narrow gap and used, it is necessary to handle the heat conduction member 453 with no solvent or a slight solvent even if mixed, and it is difficult to highly fill the highly thermally conductive filler.

In a case where the semiconductor module 300 having high heat dissipation and the semiconductor module 300 having low heat dissipation are used in the same power conversion device, control is performed in accordance with the cooling performance of the semiconductor module 300 having the lowest heat dissipation, so that the output of the power conversion device is limited. However, since the power conversion device tends to have high output, the cooling performance of the plurality of semiconductor modules 300 need to be equally improved.

In addition, the heat conduction member 453 tends to require downsizing and thinning in combination with high thermal conduction that enhances heat dissipation performance of the semiconductor module 300. It has been required to use the heat conduction member 453, which is used at a thickness of 1 mm in the related art, at less than or equal to 100 μm, and desirably less than or equal to 50 μm. For example, when comparing a case where the heat conduction member 453 is used at a thickness of 50 μm and a case where the thickness of the heat conduction member 453 is 100 μm due to a variation in the thickness of the semiconductor module 300, the thermal resistance f the semiconductor module 300 is increased by 2 times when the thickness is 100 μm. As described above, the difference in thickness of the heat conduction member 453 becomes a bottleneck of heat dissipation.

On the other hand, in a case where the heat conduction member 453 is used with a large thickness, for example, 1 mm as in the related art, the thermal resistance of the heat conduction member 453 hardly changes even if the thickness of the heat conduction member 453 varies by 50 μm. As described above, when the heat conduction member 453 is used with a thickness of less than or equal to 100 μm, and desirably less than or equal to 50 μm, it has become more important to equalize the thickness of the heat conduction member 453 in the plurality of semiconductor modules 300 arranged in parallel.

In the present embodiment, as will be described in detail later, a low rigidity portion 460 of the cooling member 340 is deformed, so that the variation in the thickness of the heat conduction member 453 can be reduced even if the thickness of the semiconductor module 300 varies following the thickness of the semiconductor module 300. Furthermore, as will be described later, the shape in which the low rigidity portion 460 is deformed can be maintained by fixing the low rigidity portion 460 with a fixing member 454. The thickness of the electric circuit body 400 can be reduced as compared with the case of sandwiching the semiconductor module 300 by fixing the low rigidity portion 460.

The heat conduction member 453 used in the present embodiment is not particularly limited as long as it is a material having a high thermal conductivity, but it is preferable to use a high thermal conduction material such as a metal, a ceramic, or a carbon-based material in combination with a resin material. In addition, a material obtained by mixing a highly thermally conductive filler with a curable resin is more preferable than a material obtained by mixing a highly thermally conductive filler with an oil such as a heat dissipation grease. This is to prevent the heat conduction member 453 from flowing out of the electric circuit body 400 due to a temperature change such as a temperature cycle or a power cycle. The resin material is not particularly limited, but it is desirable to use a silicone-based material. This is because the silicone-based material has low elastic modulus and is flexible even after curing, and thermal stress can be alleviated between the cooling member 340 and the semiconductor module 300. The highly thermally conductive filler desirably has a maximum particle size of less than or equal to 100 μm and preferably less than or equal to 50 μm. This is because although it is desired to reduce the thickness of the heat conduction member 453, it is difficult to reduce the thickness to be smaller than the maximum particle size of the highly thermally conductive filler.

As illustrated in FIG. 3, the fixing member 454 fixes the cooling member 340 to both surfaces of the plurality of semiconductor modules 300 arranged side by side. As the fixing member 454, a mechanical fixing member or an adhesive can be used. FIG. 3 illustrates an example in which an adhesive is used as the fixing member 454. In the case of fixing with an adhesive, it is desirable to use the same resin-based material as the heat conduction member 453. When the heat conduction member 453 is made of silicone-based resin, the adhesive used as the fixing member 454 is also desirably made of silicone-based resin. This is so that the respective interfaces satisfactorily come into close contact with each other.

The heat conduction member 453 usually has low adhesiveness. This is because when an additive that imparts adhesiveness is added, the additive coats the highly thermally conductive filler thus lowering the thermal conductivity. A heat conduction member 453 having high adhesiveness may be used as heat conduction member 453, in which case, the heat conduction member 453 can also be used as an adhesive for adhering the plurality of semiconductor modules 300 arranged side by side with the low rigidity portion 460 of cooling member 340. That is, the heat conduction member 453 having high adhesiveness may be used as the fixing member 454.

The insulating layers 442 and 443 of the sheet-like members 440 and 441 are not particularly limited as long as they have heat dissipation and adhesiveness, but an epoxy resin-based insulating layer in which a powdery inorganic filler is dispersed is desirable. This is because the balance between adhesiveness and heat dissipation is good. The sheet-like members 440 and 441 may be the insulating layers 442 and 443 alone, but the metal foil 444 is desirably provided on the side that comes into contact with the heat conduction member 453. The conductor plates 430, 431, 432, and 433 are desirably made of a material having high electrical conductivity and high thermal conductivity, and a metal-based material such as copper or aluminum, a composite material of a metal-based material and diamond, carbon, ceramic, or the like having high thermal conductivity, or the like can be used.

The cooling member 340 is desirably made of aluminum-based material having high thermal conductivity and light weight. The cooling member 340 is manufactured by extrusion molding, forging, brazing, or the like. The low rigidity portion 460 of the cooling member 340 is formed to have small rigidity and thin thickness. The low rigidity portion 460 is formed by, for example, a recess by press working, cutting by machining or laser machining, or the like.

Figure 5:
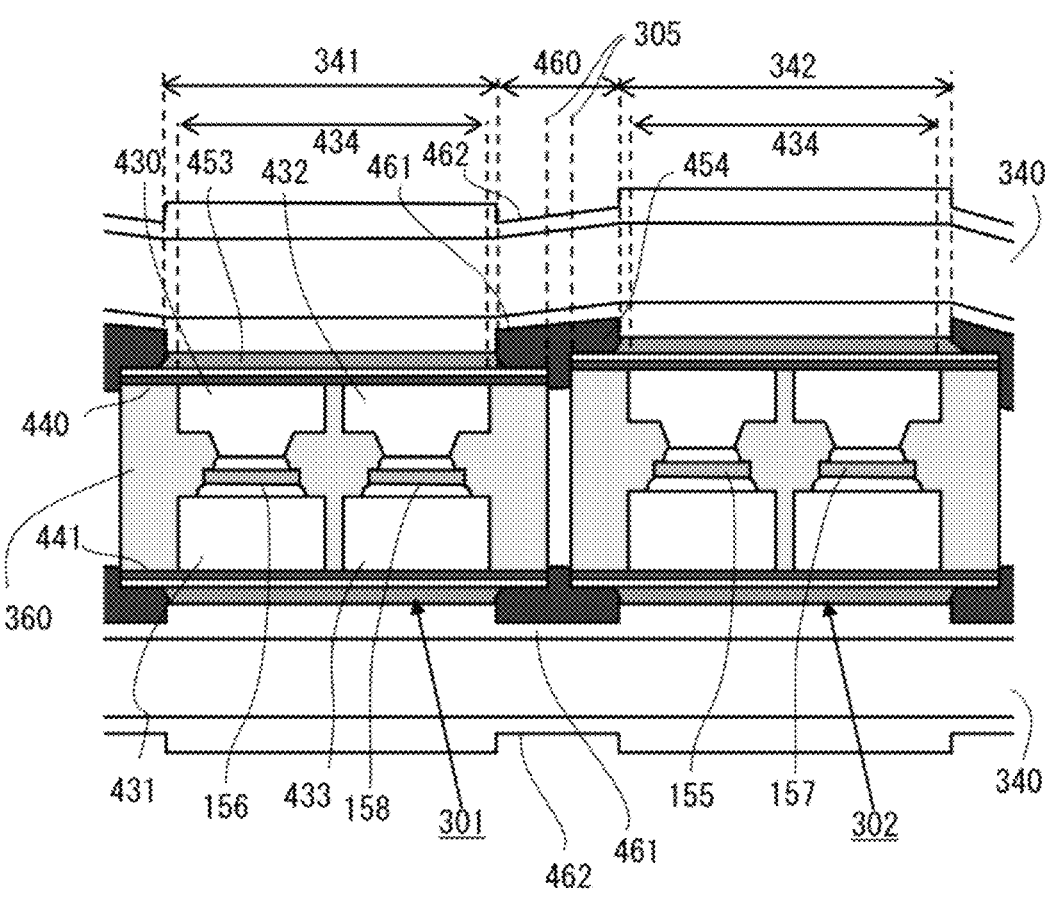
FIG. 5 is a cross-sectional view taken along line Y-Y of the electric circuit body, and illustrates a state in which two semiconductor modules are arranged side by side.

FIG. 5 is a cross-sectional view taken along line Y-Y of the electric circuit body 400, and illustrates a state in which two semiconductor modules 300 are arranged side by side. In FIG. 5, the semiconductor module 300 is referred to as a first semiconductor module 301 and a second semiconductor module 302 for the sake of convenience of explanation.

The cooling member 340 is disposed on both surfaces of the first semiconductor module 301 and the second semiconductor module 302. The cooling member 340 has a first heat dissipation region 341 that abuts on the first semiconductor module 301 through the heat conduction member 453, and a second heat dissipation region 342 that abuts on the second semiconductor module 302 through the heat conduction member 453. Furthermore, a low rigidity portion 460 having smaller rigidity and thinner thickness than the first heat dissipation region 341 and the second heat dissipation region 342 is provided between the first heat dissipation region 341 and the second heat dissipation region 342. The low rigidity portion 460 has a first recess 461 formed on the first semiconductor module 301 side and the second semiconductor module 302 side, and a second recess 462 formed on the side opposite to the first semiconductor module 301 side and the second semiconductor module 302 side. The low rigidity portion 460 may be provided with only the first recess 461 formed on the first semiconductor module 301 side and the second semiconductor module 302 side.

The fixing member 454 is disposed between the first heat dissipation region 341 and the second heat dissipation region 342 while being fitted in the first recess 461, and fixes the low rigidity portion 460 of the cooling member 340 to the first semiconductor module 301 and the second semiconductor module 302. When the heat conduction member 453 having high adhesiveness is used as described above, the heat conduction member 453 may also serve as the fixing member 454.

The first heat dissipation region 341 is larger than a conductor plate region 434 of the first semiconductor module 301, the second heat dissipation region 342 is larger than a conductor plate region 434 of the second semiconductor module 302, and the low rigidity portion 460 is formed between the first heat dissipation region 341 and the second heat dissipation region 342. The conductor plate region 434 is a region in which the power semiconductor elements 155, 156, 157, and 158 are connected to the conductor plates 430, 431, 432, and 433, respectively, and the sheet-like members 440 and 441 abut on the conductor plates 430, 431, 432, and 433, respectively, in the first semiconductor module 301 and the second semiconductor module 302.

Since the first heat dissipation region 341 is larger than the conductor plate region 434 of the first semiconductor module 301 and the second heat dissipation region 342 is larger than the conductor plate region 434 of the second semiconductor module 302, the cooling member 340 can cool the heat conducted from the power semiconductor elements 155, 156, 157, and 158 to the conductor plates 430, 431, 432, and 433. As the low rigidity portion 460 is formed between the first heat dissipation region 341 and the second heat dissipation region 342, cooling of heat conducted to the conductor plates 430, 431, 432, and 433 is not hindered, and high heat dissipation can be maintained even if rigidity is reduced by the recess.

In addition, since the region facing the low rigidity portion 460 in the semiconductor modules 301 and 302 is at a position including the end 305 which is a boundary portion of the semiconductor modules 301 and 302, the cooling member 340 can follow the difference in thickness between the semiconductor modules 301 and 302 even if the adjacent semiconductor modules 301 and 302 are arranged close to each other. With such a positional relationship, size reduction can be achieved by arranging the semiconductor modules 301 and 302 close to each other while maintaining high heat dissipation. Note that the semiconductor modules 301 and 302 may be arranged spaced apart from each other, or may be arranged in contact with each other, that is, with a separation distance of 0. In FIG. 5, a state in which two semiconductor modules 300 are arranged side by side is illustrated, but in the power conversion device, three semiconductor modules 300 are arranged side by side as illustrated in FIG. 3. Even when three semiconductor modules 300 are arranged side by side, the relationship between the adjacent semiconductor modules 300 is similar to that described with reference to FIG. 5.

FIGS. 6(a), 6(b), 6(c), and 6(d) are views showing manufacturing steps of the electric circuit body 400 of the present embodiment. Each figure is represented by a cross-sectional view taken along line Y-Y of the electric circuit body 400 shown in FIG. 1.

FIG. 6 (a) illustrates a state in which three semiconductor modules 300 are arranged side by side in contact with each other. In this figure, a state in which the thicknesses of the semiconductor modules 300 are different is emphasized.

Figures 6A, 6B, 6C, 6D:
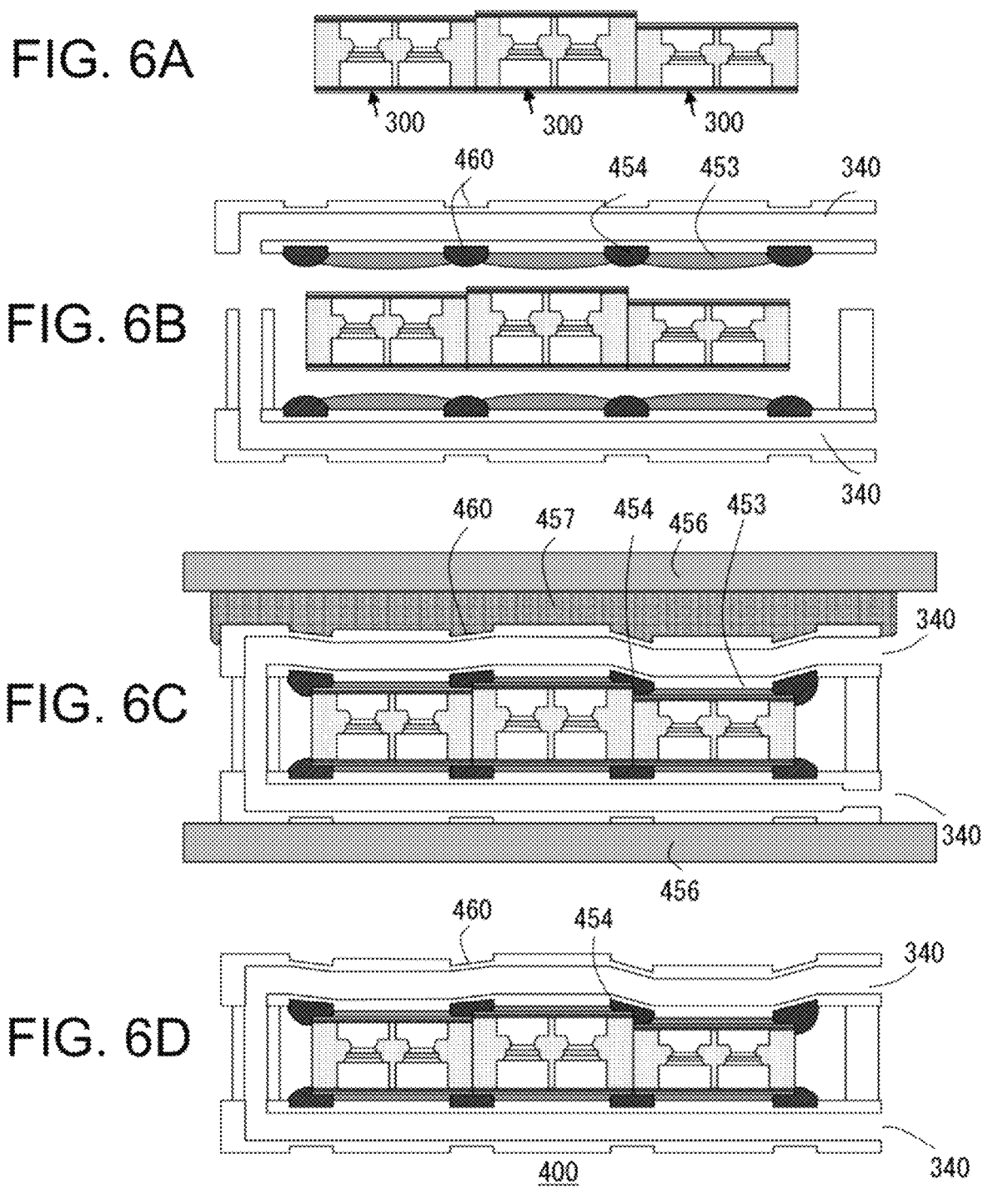
FIGS. 6A to 6D are views showing manufacturing steps of the electric circuit body.

Next, as illustrated in FIG. 6(b), the heat conduction member 453 and an adhesive serving as the fixing member 454 are applied to the cooling members 340 disposed on both surfaces (upper and lower surfaces) of the semiconductor module 300. Thereafter, after the semiconductor module 300 is disposed between the cooling members 340, the upper and lower cooling members 340 are coupled.

FIG. 6(c) illustrates a pressurizing step. The electric circuit body 400 is installed in a pressing machine including a pressurizing mechanism 456 and a flexible mechanism 457, and the adhesive serving as the fixing member 454 and the heat conduction member 453 are adhered while deforming the low rigidity portion 460 of the cooling member 340. As the adhesive and the heat conduction member 453, an adhesive that can be cured at room temperature is desirable, but in a case where a two-component addition-curable silicone resin is used, the resin can be heated from 70° C. to 120° C. and then cured in a short time. When a condensation type silicone resin is used, the curing time may be shortened by adding humidity and temperature.

Then, after at least the adhesive which is the fixing member 454 is cured, the adhesive is removed from the pressurizing mechanism 456 to obtain the electric circuit body 400 as illustrated in FIG. 6(d).

Figures 7A, 7B, 7C:
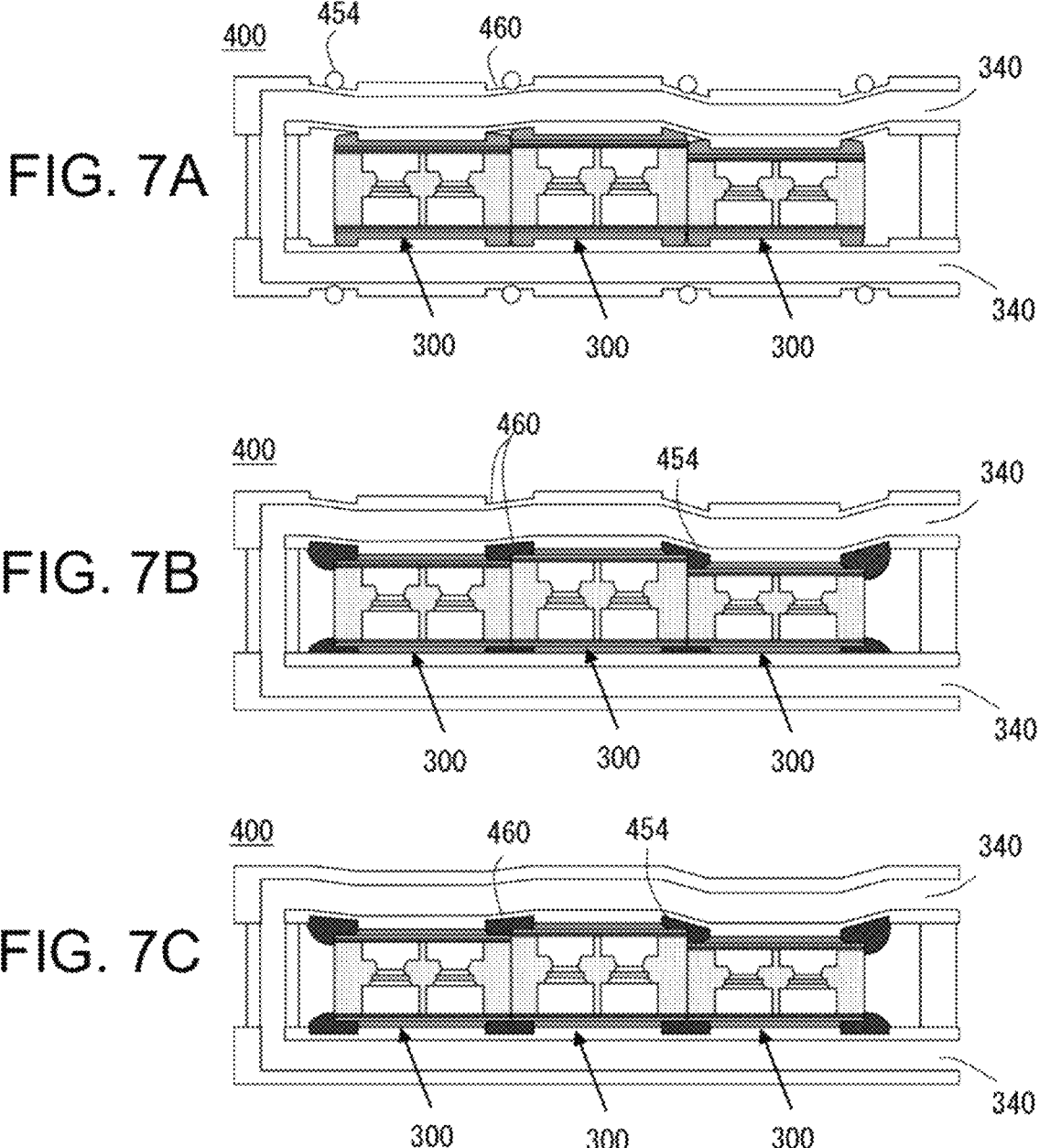
FIGS. 7A to 7C are views illustrating a modified example of the electric circuit body.

FIGS. 7(a), 7(b), and 7(c) are views showing a modified example of the electric circuit body 400 of the present embodiment. Each figure is represented by a cross-sectional view taken along line Y-Y of the electric circuit body 400 shown in FIG. 1.

In the example illustrated in FIG. 7 (a), a case where a mechanical member is used as the fixing member 454 is shown. The fixing member 454 is disposed, for example, such that a wire rod having a circular cross section abuts on the low rigidity portion 460 (second recess 462) of the cooling member 340, and fixes the cooling member 340 to both surfaces of the first semiconductor module 301 and the second semiconductor module 302 such that the cooling member 340 is tightened in the thickness direction of the electric circuit body 400 with a spring member or the like from both sides of the cooling member 340. The time for curing the adhesive can be omitted by mechanically fixing. Furthermore, since the fixing member 454 is located at the low rigidity portion 460 having small rigidity and thin thickness, the thickness of the electric circuit body 400 can be reduced.

In the example illustrated in FIG. 7(b), a case where the low rigidity portion 460 is provided only in the cooling member 340 on the upper side in the drawing is illustrated. Since the cooling member 340 on the lower side in the drawing is flat since there is no low rigidity portion 460, one surface of the semiconductor module 300 can be easily aligned. On the other hand, since the low rigidity portion 460 is provided in the cooling member 340 on the upper side, the variation in the thickness of the semiconductor module 300 can be absorbed by the deformation of the low rigidity portion 460 of the cooling member 340 on the upper side.

In the example illustrated in FIG. 7 (c), the low rigidity portion 460 of the cooling member 340 is provided only on the semiconductor module 300 side. It is possible to reduce the number of processing steps of the low rigidity portion 460 of the cooling member 340 and reduce the cost.

According to the present embodiment, since the cooling member 340 is provided with the low rigidity portion 460 formed to have small rigidity and thin thickness, the electric circuit body 400 can be thinned. Furthermore, since the low rigidity portion 460 is deformed so as to absorb the thickness variation of the semiconductor module 300, an effect that the electric circuit body 400 can be downsized by densely arranging the adjacent semiconductor modules 300 without impairing the heat dissipation of the electric circuit body 400 is obtained. In particular, when an adhesive is used as the fixing member 454, a mechanical fixing member is unnecessary, and the low rigidity portion 460 is fixed and maintained in a shape in which the low rigidity portion 460 is deformed, so that the device can be thinned and downsized while maintaining heat dissipation.

Figure 8:
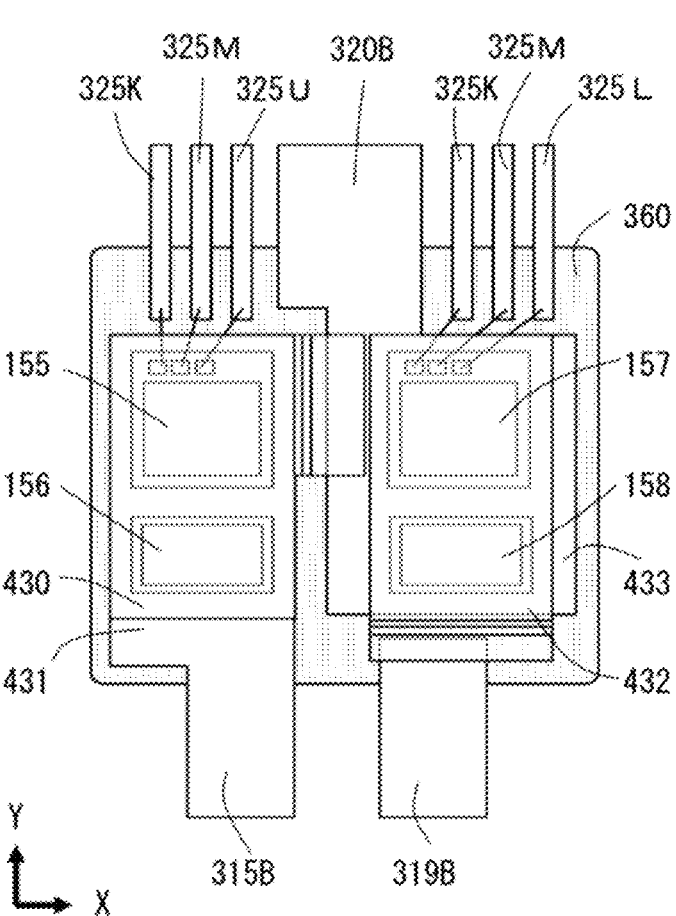
FIG. 8 is a semi-transparent plan view of the semiconductor module.
Figure 9:
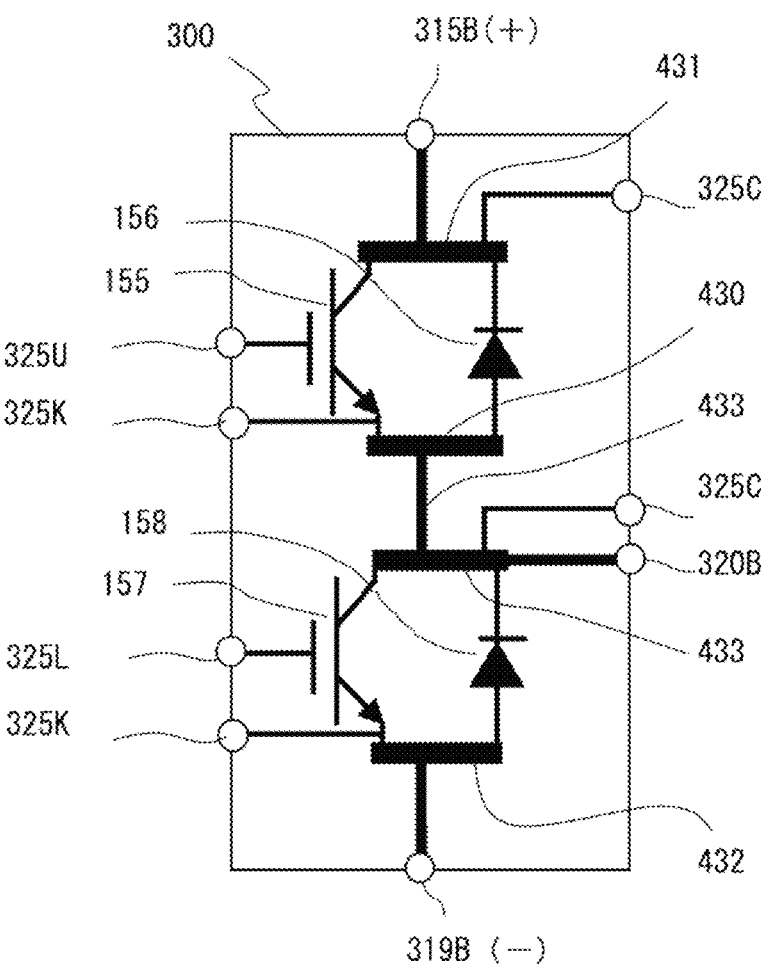
FIG. 9 is a circuit diagram of the semiconductor module.

FIG. 8 is a semi-transparent plan view of the semiconductor module 300 according to the present embodiment. FIG. 9 is a circuit diagram of the semiconductor module 300 according to the present embodiment. As shown in FIGS. 8 and 9, the positive electrode side terminal 315B is output from the collector side of the upper arm circuit, and is connected to the positive electrode side of the battery or the capacitor. The upper arm gate terminal 325U is output from a gate and an emitter sense of the active element 155 of the upper arm circuit. A negative electrode side terminal 319B is output from an emitter side of a lower arm circuit, and is connected to a negative electrode side of the battery or the capacitor or the GND. The lower arm gate terminal 325L is output from a gate and an emitter sense of the active element 157 of the lower arm circuit. An AC side terminal 320B is output from the collector side of the lower arm circuit and is connected to a motor. When a neutral point is grounded, the lower arm circuit is connected not to the GND but to the negative electrode side of the capacitor.

In addition, a conductor plate (upper arm circuit emitter side) 430 and a conductor plate (upper arm circuit collector side) 431 are arranged above and below the active element 155 and the diode 156 of the power semiconductor element (upper arm circuit). A conductor plate (lower arm circuit emitter side) 432 and a conductor plate (lower arm circuit collector side) 433 are arranged above and below the active element 157 and the diode 158 of the power semiconductor element (lower arm circuit).

The semiconductor module 300 of the present embodiment has a 2 in 1 structure, which is a structure in which two arm circuits of the upper arm circuit and the lower arm circuit are integrated into one module. In addition, a structure in which a plurality of upper arm circuits and lower arm circuits are integrated into one module may be used. In this case, the number of output terminals from the semiconductor module 300 can be reduced and the size can be reduced.

Figure 10:
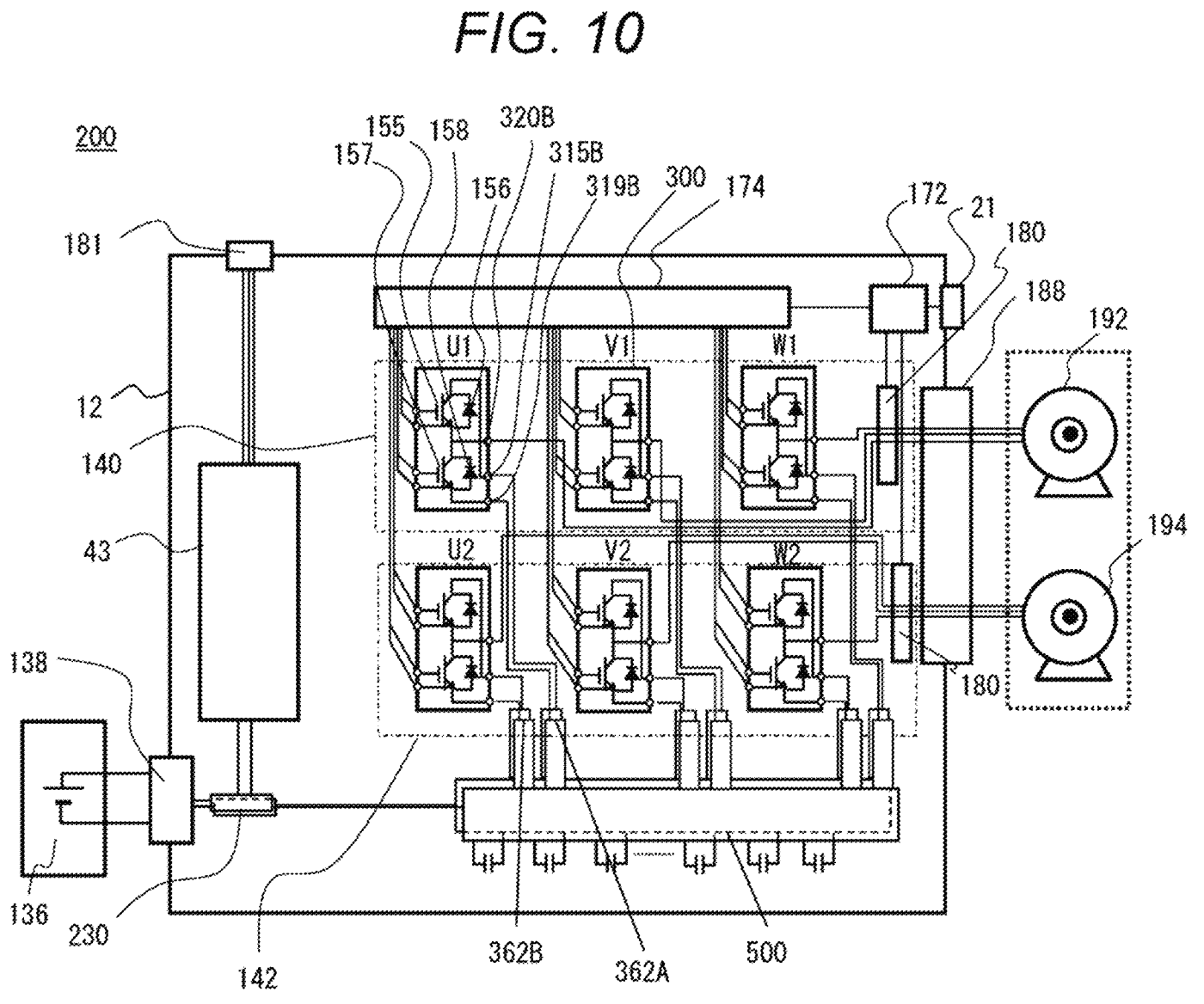

FIG. 10 is a circuit diagram of the power conversion device 200 using the semiconductor module 300 according to the present embodiment.

The power conversion device 200 includes inverter circuit units 140 and 142, an auxiliary inverter circuit unit 43, and a capacitor module 500. The inverter circuit units 140 and 142 include a plurality of semiconductor modules 300, and a three-phase bridge circuit is configured by connecting them. In a case where the current capacity is large, the semiconductor modules 300 are further connected in parallel, and the parallel connection is performed in correspondence with each phase of the three-phase inverter circuit, thereby responding to an increase in the current capacity. In addition, increase in current capacity can also be responded by parallel connecting the active elements 155 and 157 and the diodes 156 and 158, which are power semiconductor elements incorporated in the semiconductor module 300.

The inverter circuit unit 140 and the inverter circuit unit 142 have the same basic circuit configuration, and basically the same control method and operation. Since an outline of a circuit operation of the inverter circuit unit 140 and the like is well known, a detailed description thereof will be omitted here.

The upper arm circuit includes an active element 155 for the upper arm and a diode 156 for the upper arm as power semiconductor elements for switching, and the lower arm circuit includes an active element 157 for the lower arm and a diode 158 for the lower arm as power semiconductor elements for switching. The active elements 155 and 157 perform switching operation in response to a drive signal output from one or the other of the two driver circuits constituting the driver circuit 174, and convert DC power supplied from the battery 136 into three-phase AC power.

The active element 155 for the upper arm and the active element 157 for the lower arm include a collector electrode, an emitter electrode, and a gate electrode. The diode 156 for the upper arm and the diode 158 for the lower arm include two electrodes, a cathode electrode and an anode electrode.

The positive electrode side terminal 315B and the negative electrode side terminal 319B of each of the upper and lower arm series circuits are respectively connected to a DC terminal for capacitor connection of the capacitor module 500. The AC power is generated at each connecting portion of the upper arm circuit and the lower arm circuit, and the connecting portion of the upper arm circuit and the lower arm circuit of each of the upper and lower arm series circuits is connected to the AC side terminal 320B of each semiconductor module 300. The AC side terminal 320B of each semiconductor module 300 of each phase is connected to the AC output terminal of the power conversion device 200, and the generated AC power is supplied to a stator winding of the motor generator 192 or 194.

The control circuit 172 generates a timing signal for controlling the switching timing of the active element 155 for the upper arm and the active element 157 for the lower arm based on input information from a control device, a sensor (e.g., the current sensor 180), or the like on the vehicle side. The driver circuit 174 generates a drive signal for causing the active element 155 for the upper arm and the active element 157 for the lower arm to perform the switching operation based on the timing signal output from the control circuit 172. Note that reference numerals 181 and 188 denote connectors.

The upper and lower arm series circuits include a temperature sensor (not illustrated), and temperature information of the upper and lower arm series circuits is input to the microcomputer. Voltage information on the DC positive electrode side of the upper and lower arm series circuits is input to the microcomputer. The microcomputer performs overtemperature detection and overvoltage detection based on these pieces of information, stops the switching operation of all the active elements 155 for the upper arm and the active elements 157 for the lower arm when overtemperature or overvoltage is detected to protect the upper and lower arm series circuits from overtemperature or overvoltage.

Figure 11:
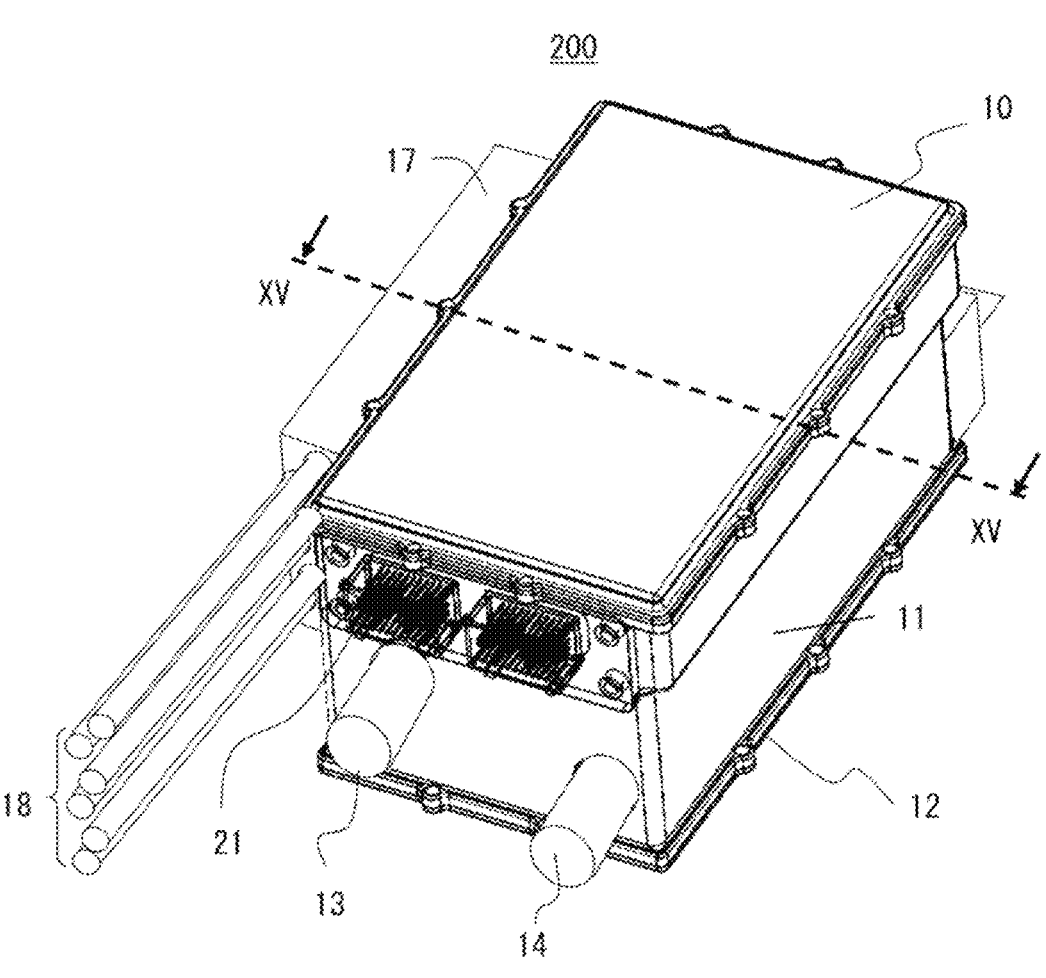
FIG. 11 is an outer appearance perspective view of the power conversion device.
Figure 12:
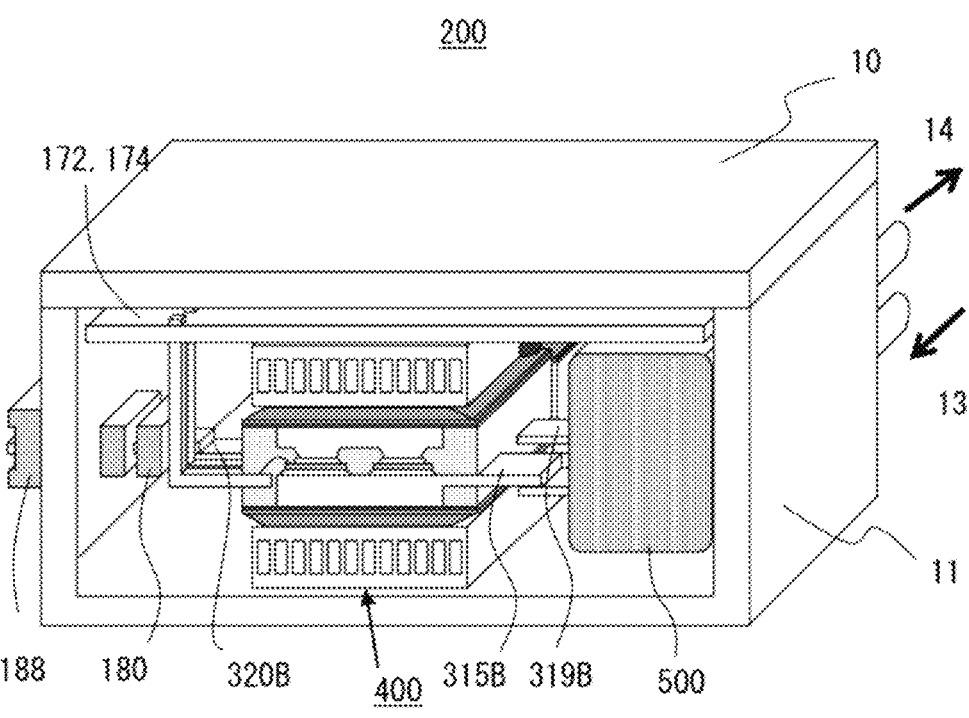
FIG. 12 is a cross-sectional view taken along line XV-XV of the power conversion device.

FIG. 11 is an external perspective view illustrating an example of the power conversion device 200 illustrated in FIG. 10, and FIG. 12 is a cross-sectional view taken along line XV-XV of the power conversion device illustrated in FIG. 11.

The power conversion device 200 includes a housing 12 that is configured by a lower case 11 and an upper case 10 and is formed in a substantially rectangular parallelepiped shape. An electric circuit body 400, a capacitor module 500, and the like are accommodated in the housing 12. The electric circuit body 400 has a cooling flow path, and a cooling water inflow pipe 13 and a cooling water outflow pipe 14 communicating with the cooling flow path are protruded from one side surface of the housing 12. As illustrated in FIG. 12, the lower case 11 has an opening on the upper part side (Z direction), and the upper case 10 is attached to the lower case 11 by closing the opening of the lower case 11. The upper case 10 and the lower case 11 are formed of an aluminum alloy or the like, and are fixed while being sealed with respect to the outside. The upper case 10 and the lower case 11 may be integrated. Since the housing 12 has a simple rectangular parallelepiped shape, attachment to a vehicle or the like is facilitated, and production is facilitated.

As illustrated in FIG. 11, a connector 17 is attached to one side surface in the longitudinal direction of the housing 12, and an AC terminal 18 is connected to the connector 17. Furthermore, a connector 21 is provided on a surface from which the cooling water inflow pipe 13 and the cooling water outflow pipe 14 are led out.

As illustrated in FIG. 12, the electric circuit body 400 is accommodated in the housing 12. The control circuit 172 and the driver circuit 174 are disposed above the electric circuit body 400, and the capacitor module 500 is accommodated on the DC terminal side of the electric circuit body 400. The power conversion device 200 can be thinned, and the degree of freedom in installation to the vehicle is improved by disposing the capacitor module 500 at the same height as the electric circuit body 400. The AC side terminal 320B of the electric circuit body 400 is penetrated through the current sensor 180 and joined to the bus bar. The positive electrode side terminal 315B and the negative electrode side terminal 319B, which are DC terminals of the semiconductor module 300, are joined to the positive and negative electrode terminals of the capacitor module 500, respectively.

The embodiment described above has the following operation effect.

(1) The electric circuit body 400 includes a first semiconductor module 301 and a second semiconductor module 302 in which the power semiconductor elements 155, 156, 157, and 158 are sealed, respectively, a cooling member 340 that cools heat transferred from the power semiconductor elements 155, 156, 157, and 158, and a fixing member 454 that fixes the cooling member 340 to both surfaces of the first semiconductor module 301 and the second semiconductor module 302 arranged side by side, where at least one of the cooling members 340 fixed to both surfaces of the first semiconductor module 301 and the second semiconductor module 302 includes a first heat dissipation region 341 that abuts on the first semiconductor module 301 through the heat conduction member 453, a second heat dissipation region 342 that abuts on the second semiconductor module 302 through the heat conduction member 453, and a low rigidity portion 460 formed between the first heat dissipation region 341 and the second heat dissipation region 342 so as to have lower rigidity the first heat dissipation region 341 and the second heat dissipation region 342, and the fixing member 454 fixes the cooling member 340 to both surfaces of the first semiconductor module 301 and the second semiconductor module 302 in the low rigidity portion 460 of the cooling member 340. As a result, the device can be thinned while maintaining heat dissipation.

The present invention is not limited to the embodiments described above, and other modes conceivable within the scope of the technical idea of the present invention are also included in the scope of the present invention as long as the characteristics of the present invention are not impaired. In addition, the embodiment described above and a plurality of modified examples may be combined.

REFERENCE SIGNS LIST

155, 156, 157, 158 power semiconductor element
192, 194 motor generator of AC circuit
300 semiconductor module
301 first semiconductor module
302 second semiconductor module
315B positive electrode side terminal
319B negative electrode side terminal
320B AC side terminal
325L lower arm gate terminal
325M mirror emitter signal terminal
325K Kelvin emitter signal terminal
325U upper arm gate terminal
325M mirror emitter signal terminal
325K Kelvin emitter signal terminal
340 cooling member
341 first heat dissipation region
342 second heat dissipation region
360 sealing member
400 electric circuit body
430, 431, 432, 433 conductor plate
434 conductor plate region
442, 443 insulating layer
440, 441 sheet-like member
444 metal foil
453 heat conduction member
454 fixing member
460 low rigidity portion
461 first recess
462 second recess
500 capacitor module

The invention claimed is:

1. An electric circuit body comprising:
a first semiconductor module and a second semiconductor module in which power semiconductor elements are sealed, respectively;
a cooling member that cools heat transferred from the power semiconductor elements; and
a fixing member that fixes the cooling member to both surfaces of the first semiconductor module and the second semiconductor module arranged side by side,
wherein the cooling member fixed to both surfaces of the first semiconductor module and the second semiconductor module and includes a first heat dissipation region that abuts on the first semiconductor module through a heat conduction member, a second heat dissipation region that abuts on the second semiconductor module through the heat conduction member, and a low rigidity portion formed between the first heat dissipation region and the second heat dissipation region to have lower rigidity than the first heat dissipation region and the second heat dissipation region, and
the fixing member fixes the cooling member to both surfaces of the first semiconductor module and the second semiconductor module in the low rigidity portion of the cooling member.

2. The electric circuit body according to claim 1, wherein the fixing member is an adhesive that is disposed between the first heat dissipation region and the second heat dissipation region and adheres the low rigidity portion of the cooling member to the first semiconductor module and the second semiconductor module.

3. The electric circuit body according to claim 1, wherein the heat conduction member also serves as the fixing member.

4. The electric circuit body according to claim 1, wherein the low rigidity portion of the cooling member has a first recess formed on the first semiconductor module side and the second semiconductor module side, and the fixing member is disposed while being fitted in the first recess.

5. The electric circuit body according to claim 1, wherein the low rigidity portion of the cooling member has a second recess formed on a side opposite to the first semiconductor module side and the second semiconductor module side.

6. The electric circuit body according to claim 5, wherein the fixing member is disposed to abut on the second recess, and fixes the cooling member to both surfaces of the first semiconductor module and the second semiconductor module by tightening the cooling member in a thickness direction of the electric circuit body.

7. The electric circuit body according to claim 1, wherein the first heat dissipation region is larger than a region where the power semiconductor element of the first semiconductor module is connected to a conductor plate, and the second heat dissipation region is larger than a region where the power semiconductor element of the second semiconductor module is connected to a conductor plate.

8. The electric circuit body according to claim 7, wherein the first semiconductor module and the second semiconductor module adjacent to the first semiconductor module are disposed spaced apart from each other.

9. The electric circuit body according to claim 7, wherein the first semiconductor module and the second semiconductor module adjacent to the first semiconductor module are disposed in contact with each other.

10. The electric circuit body according to claim 8, wherein a boundary portion between the first semiconductor module and the second semiconductor module adjacent to the first semiconductor module is arranged in a region facing the low rigidity portion.

11. A power conversion device comprising the electric circuit body described in claim 1, wherein the power conversion device converts DC power into AC power.

* * * * *